(12) United States Patent
Laxman et al.

(10) Patent No.: US 7,293,569 B2
(45) Date of Patent: Nov. 13, 2007

(54) ALKYLSILANES AS SOLVENTS FOR LOW VAPOR PRESSURE PRECURSORS

(75) Inventors: Ravi Laxman, San Jose, CA (US); Ashutosh Misra, Plano, TX (US); Jean-Marc Girard, Paris (FR)

(73) Assignee: Air Liquide Electronics U.S. LP, Houston, TX (US)

( * ) Notice: Subject to any disclaimer, the term of this patent is extended or adjusted under 35 U.S.C. 154(b) by 0 days.

(21) Appl. No.: 11/456,259

(22) Filed: Jul. 10, 2006

(65) Prior Publication Data

US 2007/0131252 A1 Jun. 14, 2007

Related U.S. Application Data

(60) Provisional application No. 60/750,015, filed on Dec. 13, 2005.

(51) Int. Cl.
*B08B 9/00* (2006.01)
(52) U.S. Cl. ............... 134/22.1; 134/22.11; 134/22.14; 134/22.16; 134/22.17; 134/22.19; 134/26; 134/34; 134/36; 134/42; 134/902
(58) Field of Classification Search ............... 134/22.1, 134/22.11, 22.14, 22.16, 22.17, 22.19, 26, 134/34, 36, 42, 902
See application file for complete search history.

(56) References Cited

U.S. PATENT DOCUMENTS

| | | | | |
|---|---|---|---|---|
| 4,723,363 A * | 2/1988 | Seelbach et al. | ............... | 34/339 |
| 5,129,958 A * | 7/1992 | Nagashima et al. | ........ | 134/22.1 |
| 5,326,723 A * | 7/1994 | Petro et al. | .................. | 438/685 |
| 5,405,935 A * | 4/1995 | Westerhoff | .................. | 528/277 |
| 5,489,394 A * | 2/1996 | Ford et al. | .................. | 510/245 |
| 5,964,230 A | 10/1999 | Voloshin et al. | | |
| 6,127,269 A * | 10/2000 | Liaw et al. | .................. | 438/682 |
| 6,133,162 A * | 10/2000 | Suzuki et al. | ............... | 438/780 |
| 6,214,130 B1 * | 4/2001 | Sasaki | .......................... | 134/19 |
| 6,255,222 B1 * | 7/2001 | Xia et al. | .................... | 438/710 |
| 6,432,903 B1 * | 8/2002 | Dudley | ....................... | 510/407 |
| 2003/0131885 A1 * | 7/2003 | Birtcher et al. | ............. | 137/240 |
| 2003/0232504 A1 * | 12/2003 | Eppler et al. | ............... | 438/709 |
| 2005/0028841 A1 * | 2/2005 | Zorich et al. | .................. | 134/26 |
| 2005/0051234 A1 * | 3/2005 | Steidl et al. | ................. | 141/234 |
| 2006/0169669 A1 * | 8/2006 | Zojaji et al. | ................... | 216/58 |

FOREIGN PATENT DOCUMENTS

EP 1 327 603 7/2003

OTHER PUBLICATIONS

International Search Report for PCT/IB2006/003427.
Database WPI Week 199727, Derwent Publications Ltd., London, GB; AN 1997-295280, XP002431471 & JP 09 111299 (Sumitomo Chem. Co. Ltd.), Apr. 28, 1997 Abstract.

* cited by examiner

*Primary Examiner*—Sharidan Carrillo
(74) *Attorney, Agent, or Firm*—Brandon Clark

(57) ABSTRACT

Compositions and methods for cleaning deposition systems utilizing alkylsilanes are described herein. In an embodiment, a method of cleaning a semiconductor fabrication system comprises flushing the system with a solvent comprising at least one alkylsilane. In another embodiment, a method of removing at least one chemical precursor from a semiconductor fabrication system comprises forcing a solvent containing at least one alkylsilane through the semiconductor fabrication system and dissolving the at least one chemical precursor in the solvent. The solvent may also contain mixtures of different alkylsilanes and other organic solvents.

23 Claims, No Drawings

ALKYLSILANES AS SOLVENTS FOR LOW VAPOR PRESSURE PRECURSORS

CROSS-REFERENCE TO RELATED APPLICATIONS

This application claims priority to U.S. application Ser. No. 60/750,015, filed on Dec. 13, 2005 and incorporated herein by reference.

STATEMENT REGARDING FEDERALLY SPONSORED RESEARCH OR DEVELOPMENT

Not applicable

FIELD OF THE INVENTION

This invention relates generally to the field of thin film deposition. More specifically, the invention relates to a method of cleaning deposition systems to remove residual chemical precursors.

BACKGROUND

In chemical vapor deposition, after canister changes and process runs, the residual chemicals remaining in the metal delivery lines and containers must be thoroughly cleaned Organometallic precursors and inorganic chemicals are used in the deposition of thin films using chemical vapor deposition (CVD) or atomic layer deposition (ALD) techniques. Many of these precursors are extremely sensitive to air and decompose rapidly in the presence of oxygen, water, or high temperature. The decomposition products contaminate the deposition chambers and delivery lines.

A common method employed to prevent contamination is to flush the delivery lines with a solvent. Presently, hydrocarbon solvents are the most commonly used solvents. Examples include pentane, hexane, and octane. However, the chemical precursors used in chemical vapor deposition have limited solubility in such solvents. Thus, high volumes of these solvents are required in order to effectively remove the residual precursors. Furthermore, some of these solvents have relatively low vapor pressures, making them difficult to dry. In some cases, existing solvents may contain unacceptable levels of moisture, which may contaminate and corrode the deposition chambers and delivery lines.

Consequently, there is a need for a universal, stable solvent that is capable of dissolving CVD precursors and has a high enough vapor pressure to achieve a desired rate of drying.

BRIEF SUMMARY

Compositions and methods for cleaning semiconductor fabrication systems utilizing alkylsilanes are described herein. Alkylsilanes are a low-cost alternative to solvents presently being used in the industry. Not only are alkylsilanes cost effective, but they also meet the other criteria for an effective cleaning solvent. In particular, alkylsilanes are highly volatile, i.e. they have low boiling points and do not tend to react with the chemical residues left behind in a semiconductor manufacturing processes. Further, the chemical residues left by the deposition process are highly soluble in alkylsilanes. Moreover, alkylsilanes tend to have extremely low water content. Thus, solvents utilizing alkylsilanes present several advantages over the prior art.

These and other needs in the art are addressed in one embodiment by a method of cleaning a semiconductor fabrication system comprising flushing the system with a solvent comprising at least one alkylsilane.

In another embodiment, a method of removing at least one chemical precursor from a semiconductor fabrication system comprises forcing a solvent containing at least one alkylsilane through the semiconductor fabrication system and dissolving the at least one chemical precursor in the solvent.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the concepts and specific embodiments disclosed herein may be readily utilized as a basis for modifying or designing other structures for carrying out the same purposes of the present invention. It should also be realized by those skilled in the art that such equivalent constructions do not depart from the scope of the invention as set forth in the appended claims.

NOTATION AND NOMENCLATURE

Certain terms are used throughout the following description and claims to refer to particular system components. This document does not intend to distinguish between components that differ in name but not function.

In the following discussion and in the claims, the terms "including" and "comprising" are used in an open-ended fashion, and thus should be interpreted to mean "including, but not limited to . . . ".

DETAILED DESCRIPTION OF THE PREFERRED EMBODIMENTS

In one embodiment, the present invention provides a method of cleaning a semiconductor fabrication system by flushing the system with a solvent comprising at least one alkylsilane. Alkylsilanes are compounds that are polar, extremely stable, and have relatively high vapor pressures at low temperatures. Preferably, the alkylsilanes used in the present invention have a vapor pressure equal to or greater than about 80 kPa (600 torr) at 25° C.

In particular embodiments, the alkylsilane has the following structure:

$$Si(R)_n,$$

where R comprises any suitable alkyl group and n is an integer representing the number of alkyl groups attached to the Si atom. In preferred embodiments, R is an alkyl group containing from 1 to 10 carbons, and preferably from about 1 to 4 carbons, In preferred embodiments, R is a methyl group. Examples of other suitable alkyl groups include without limitation, ethyl groups, propyl groups, isopropyl groups, butyl groups, tubby groups, etc. Also in preferred embodiments, "n" is an integer ranging from 1 to 4. According to preferred embodiments, n equals 4. In a specific embodiment, the alkylsilane is tetramethylsilane (TOMS).

In another embodiment, the alkylsilane has the following formula:

$$Si_2(R)_n,$$

where n again is an integer representing the number of alkyl groups attached to the Si atoms, Preferably, n equals 6.

However, n may range from 1 to 6 alkyl groups R again may be any suitable alkyl group, but preferably a methyl group.

According to a preferred embodiment, the solvent comprises at least 95% alkylsilane by weight, and more preferably at least 99% alcylsilane by weight. In further embodiments, the solvent comprises a mixture of at least two or more different alkylsilane compositions. By way of example only, about 50% by weight of the solvent may comprise tetramethylsilane and about 50% by weight of the solvent may comprise tetraethylsilane.

In other embodiments, the solvent comprises a mixture of an alkylsilane and other solvents. Examples of other solvents include without limitation, hydrocarbons (e.g. pentanes, hexanes, octanes), ethers (e.g. diethylethers, tetrahydrofuran), amines (e.g. triethylamine), ketones (e.g. acetone), and alcohol (e.g. Iso-propylalcohol), etc. In one embodiment, the solvent mixture comprises about 50% by weight alkylsilane and about 50% by weight of other solvents. Additionally, the alkylsilane-containing solvent comprises less than about 10 ppm water, more preferably less than about 5 ppm water.

The present alkylsilane solvent compositions are capable of cleaning the surfaces of a semiconductor fabrication system, which are typically made of metal such as stainless steel. In addition, the solvent compositions disclosed herein are capable of cleaning the surfaces of any materials used in semiconductor fabrication systems. It has been found that the present solvent compositions are capable of dissolving the residues left by organometallic compounds and inorganic chemicals that are used in semiconductor fabrication. Examples of such compounds include without limitation, transition metal complexes of Ti, Ta, Nb, Hf, Si, La, Ru, Pt, Cu, etc. Examples of transition metal complexes include without limitation, titanium chloride, hafnium chloride, titanium amide complexes, $Hf(NRLR')_4$, $Ti(NRR')_4$, $Ta(NN')_5$, $Si(NRR')_4$, lanthanum trimethytsilylacetylene (La(TMSA)), ruthenium alkyls, dopants such as triethoxyboron (TEB), triethylphosphite (TEPO), trimethylphosphite (TMPO), or combinations thereof. Furthermore, the present alkylsilane solvents are substantially inert to these chemical precursors. In other words, the solvent does not react with the chemical precursor or its residue to form additional contaminating compounds.

In one embodiment, a method of removing at least one chemical precursor from a semiconductor fabrication system comprises forcing a solvent containing at least one alkylsilane through the semiconductor fabrication system. Forcing an alkylsilane solvent through the fabrication system serves to remove any chemical precursors or residue remaining after a fabrication process. As the alkylsilane solvent contacts the metal surfaces of the system, it dissolves any chemical precursor residue remaining in the system. The solvent preferably is in contact with the metal surfaces of the system for a time sufficient to dissolve all of the residual chemical precursors. Typically, the solvent is flushed through the lines at a flow rate ranging from about 0.1 to about 5 standard liters/min. The flushed solvent is either removed through the exhaust dry pump if it is present in small quantities or it can be collected in a solvent waste canister on the tool for disposal periodically.

The present methods may be incorporated in any solvent purging process or sequence generally known to those of ordinary skill in the art. For example, in a typical solvent purging sequence, the valves from the chemical precursor storage container are first shut off. A solvent purge operation is then initiated, in which an alkylsilane-containing solvent from a solvent tank or canister is flushed or pumped through the fabrication system. Generally, a fabrication system comprises many components including without limitation, the chemical delivery cabinet, the lines where the precursor has wetted the surface, the intermediate valves, the mass flow controllers, the vaporizer on the wafer manufacturing system, and the like. The solvent purge operation may be completely automated or performed manually. The alkylsilane solvent composition is flushed or forced through a fabrication system by pressurizing a solvent with an inert gas, for example $N_2$ or He, and then using vacuum to dry the residual solvent in the lines.

After forcing the solvent through the system, the solvent is removed from the system along with the chemical precursors or residue dissolved therein. Complete removal of the solvent can be accomplished by evaporating the solvent under vacuum. Alternatively, nitrogen or some other inert gas may be blown through the system to dry the alkylsilane solvent. Generally, the system is repeatedly flushed and dried at least 10 times, preferably 20 times, more preferably 30 times. Moreover, in other embodiments, the semiconductor fabrication system is flushed and dried such that a desired base pressure of $10^{-7}$ to $10^{-9}$ torr is achieved where approximately less than 10 ppm of chemical precursor remains in the system.

In general, the alkylsilane is used to clean the delivery lines of a semiconductor or thin film fabrication system. However, the alkylsilane may be used to clean any containers, chambers, tools, or valves in the system that are in contact with chemical precursors that are prone to decomposition in the presence of air. A semiconductor fabrication system includes any part, line, valve, chamber, process tool, container involved in manufacturing semiconductors. Examples of semiconductor fabrication systems include without limitation, chemical vapor deposition systems, thin film fabrication systems, atomic layer deposition systems, and the like.

Although the present invention and its advantages have been described in detail, it should be understood that various changes, substitutions and alterations may be made herein without departing from the scope of the invention as defined by the appended claims.

What is claimed is:

1. A method of cleaning at least one delivery line in a semiconductor fabrication system comprising:
   flushing the semiconductor fabrication system by dissolving at least one chemical precursor used in semiconductor fabrication in the at least one delivery line with a solvent to clean the at least one delivery line, wherein the solvent comprises at least one alkylsilane having the formula: $Si(R)_4$ or $Si_2(R)_6$, wherein R is an alkyl group.

2. The method of claim 1, wherein the alkylsilane has the formula $Si(R)_n$ and n equals 4.

3. The method of claim 1, wherein the at least one alkylsilane is tetramethylsilane.

4. The method of claim 1, wherein R comprises an alkyl from the group consisting of an ethyl, a propyl, iso-propyl, butyl, or t-butyl.

5. The method of claim 1, wherein the solvent comprises a mixture of at least one alkylsilane and at least one organic solvent.

6. The method of claim 1, further comprising drying the solvent from the system by reducing the pressure of the semiconductor fabrication system below atmospheric pressure.

7. The method of claim 1, comprising dissolving said at least one chemical precursor in a plurality of delivery lines in the semiconductor system., 8. The method of claim 5, wherein the at least one organic solvent is selected from the group consisting of dichloromethane, acetone, chloroform, pentane, hexane, heptane, octane, and ethyl ether.

9. The method of claim 6, further comprising drying the system such that less than about 10 ppm water remains in the system.

10. The method of claim 6, further comprising flushing and drying the system more than once.

11. The method of claim 6, comprising flushing and drying the system about 10 to 30 times.

12. The method of claim 9, further comprising drying the system such that less than about 10 ppm of at least one chemical precursor used in semiconductor fabrication remains in the system.

13. A method of removing at least one chemical precursor used in semiconductor fabrication from at least one delivery line in a semiconductor fabrication system comprising:
   a) forcing a solvent containing at least one delivery line, said solvent comprises at least one alkylsilane having the formula: $Si(R)_4$ or $Si_2(R)_6$, wherein R is an alkyl group; and
   b) dissolving the at least one chemical precursor in the solvent to remove the at least one chemical precursor from the at least one delivery line.

14. The method of claim 13, wherein R is a methyl group.

15. The method of claim 13, wherein the at least one alkylsilane is tetramethylsilane.

16. The method of claim 15, wherein the alkylsilane has the formula $Si(R)_n$ and n equals 4.

17. The method of claim 15, wherein the at least one chemical precursor used in semiconductor fabrication is a transition metal complex selected from the group consisting of titanium chloride, hafnium chloride, titanium amide complexes, lanthanum trimethylsilylacetylene, ruthenium alkyls, and combinations thereof.

18. The method of claim 13, wherein the solvent comprises at least about 99% alkylsilane by weight.

19. The method of claim 13, wherein the solvent comprises a mixture of different alkylsilanes.

20. The method of claim 13, wherein the solvent comprises a mixture of at least one alkylsilane and at least one organic solvent.

21. The method of claim 13, wherein the solvent comprises less than about 10 ppm water.

22. The method of claim 13, comprising forcing the solvent through a plurality of delivery lines.

23. The method of claim 13, further comprising removing the solvent from the semiconductor fabrication system.

* * * * *

UNITED STATES PATENT AND TRADEMARK OFFICE
CERTIFICATE OF CORRECTION

| | | |
|---|---|---|
| PATENT NO. | : 7,293,569 B2 | Page 1 of 1 |
| APPLICATION NO. | : 11/456259 | |
| DATED | : November 13, 2007 | |
| INVENTOR(S) | : Ravi Laxman, Ashutosh Misra and Jean-Marc Girard | |

It is certified that error appears in the above-identified patent and that said Letters Patent is hereby corrected as shown below:

In Column 5, line 22, replace the word "containing" with the words --through the--.

In Column 6, line 4, replace the words "claim 15" with the words --claim 13--.

In Column 6, line 6, replace the words "claim 15" with the words --claim 13--.

Signed and Sealed this

Twenty-seventh Day of May, 2008

JON W. DUDAS
*Director of the United States Patent and Trademark Office*